US009488719B2

(12) United States Patent
Schmalenberg et al.

(10) Patent No.: US 9,488,719 B2
(45) Date of Patent: Nov. 8, 2016

(54) AUTOMOTIVE RADAR SUB-SYSTEM PACKAGING FOR ROBUSTNESS

(71) Applicant: TOYOTA MOTOR ENGINEERING & MANUFACTURING NORTH AMERICA, INC., Erlanger, KY (US)

(72) Inventors: Paul D. Schmalenberg, Ann Arbor, MI (US); Jae Seung Lee, Ann Arbor, MI (US)

(73) Assignee: Toyota Motor Engineering & Manufacturing North America, Inc., Erlanger, KY (US)

( * ) Notice: Subject to any disclaimer, the term of this patent is extended or adjusted under 35 U.S.C. 154(b) by 384 days.

(21) Appl. No.: 14/292,357

(22) Filed: May 30, 2014

(65) Prior Publication Data
US 2015/0346322 A1     Dec. 3, 2015

(51) Int. Cl.
*G01S 7/02*         (2006.01)
*G01S 13/02*      (2006.01)
(Continued)

(52) U.S. Cl.
CPC ............. *G01S 7/02* (2013.01); *G01S 13/02* (2013.01); *G01S 13/931* (2013.01); *H01Q 1/3233* (2013.01); *H01Q 13/206* (2013.01); *H01Q 21/065* (2013.01); *G01S 2007/027* (2013.01); *H05K 1/144* (2013.01); *H05K 2201/10098* (2013.01); *Y10T 29/49004* (2015.01)

(58) Field of Classification Search
CPC ........ G01S 7/02; G01S 13/931; G01S 13/02; G01S 2007/027; H01Q 1/3233; H01Q 21/065; H01Q 13/206; H05K 1/144; H05K 2201/10098; Y10T 29/49004

USPC .............................................. 342/175, 70–72
See application file for complete search history.

(56) References Cited

U.S. PATENT DOCUMENTS

| | | | |
|---|---|---|---|
| 5,982,250 | A | 11/1999 | Hung et al. |
| 6,232,920 | B1 | 5/2001 | Brookner et al. |

(Continued)

FOREIGN PATENT DOCUMENTS

| | | | | |
|---|---|---|---|---|
| CN | 103066360 | | 4/2013 | |
| DE | 102010040809 | A1 * | 3/2012 | .......... H01Q 1/3233 |

(Continued)

OTHER PUBLICATIONS

B. Al-Khateeb, V. Rabinovich, B. Oakley and N. Alexandrov, "Compact planar antennas for short-range wireless automotive communication," in IEEE Transactions on Vehicular Technology, vol. 55, No. 4, pp. 1425-1435, July 2006.*

*Primary Examiner* — John B Sotomayor
(74) *Attorney, Agent, or Firm* — Snell & Wilmer LLP

(57) ABSTRACT

An integrated circuit for processing transmitted and received signals is positioned on a first printed circuit board. A second printed circuit board is provided which has a plurality of antenna elements and at least one transmission line. The first printed circuit board is bonded to a first side of a metal housing and the second printed circuit board is bonded to a second side of the metal housing, so that the integrated circuit is sealed from environmental exposure between the first printed circuit board and the metal housing. A waveguide chamber is provided and is located between the first printed circuit board and the second printed circuit board. A signal is allowed to propagate from the integrated circuit to the metal trace to the square metal section to the waveguide chamber to the at leas one transmission line to the plurality of antenna elements.

20 Claims, 5 Drawing Sheets

(51) Int. Cl.
*G01S 13/93* (2006.01)
*H01Q 1/32* (2006.01)
*H01Q 13/20* (2006.01)
*H01Q 21/06* (2006.01)
*H05K 1/14* (2006.01)

(56) References Cited

U.S. PATENT DOCUMENTS

| | | |
|---|---|---|
| 6,249,242 B1 | 6/2001 | Sekine et al. |
| 6,791,495 B2 | 9/2004 | Chang et al. |
| 6,967,347 B2 | 11/2005 | Estes et al. |
| 6,982,480 B2 | 1/2006 | Shi |
| 7,102,458 B2 | 9/2006 | Koriyama et al. |
| 7,227,508 B2 | 6/2007 | Wang et al. |
| 7,420,436 B2 | 9/2008 | Stenger |
| 7,436,679 B2 | 10/2008 | Iijima et al. |
| 7,733,265 B2 | 6/2010 | Margomenos et al. |
| 7,830,301 B2 | 11/2010 | Margomenos |
| 7,881,689 B2 | 2/2011 | Leblanc et al. |
| 9,332,680 B2 * | 5/2016 | Ding ................ H05K 9/0016 |
| 2005/0225481 A1 * | 10/2005 | Bonthron ............ G01S 7/032 342/175 |
| 2006/0000591 A1 * | 1/2006 | Adams ............ H01L 23/3733 165/185 |
| 2006/0097912 A1 * | 5/2006 | Isono ................ H01Q 1/3233 342/175 |
| 2006/0103003 A1 * | 5/2006 | Heide ............ H01L 23/3135 257/700 |
| 2007/0216587 A1 * | 9/2007 | Schmidt ............ B60C 23/0444 343/711 |
| 2009/0195440 A1 * | 8/2009 | Saunders ............ G01S 7/032 342/175 |
| 2009/0251362 A1 * | 10/2009 | Margomenos ........ G01S 7/032 342/175 |
| 2011/0304520 A1 * | 12/2011 | Djordjevic ........ H01Q 21/0087 343/893 |
| 2012/0187511 A1 | 7/2012 | Maurer et al. |
| 2013/0249732 A1 | 9/2013 | Choi et al. |
| 2015/0181346 A1 * | 6/2015 | Jingming ............ H04R 1/02 381/114 |
| 2015/0346322 A1 * | 12/2015 | Schmalenberg ........ G01S 7/02 342/175 |

FOREIGN PATENT DOCUMENTS

| | | | |
|---|---|---|---|
| JP | 2002208807 | 7/2002 | |
| WO | WO 03090313 A1 * | 10/2003 | ............. H01P 5/107 |

* cited by examiner

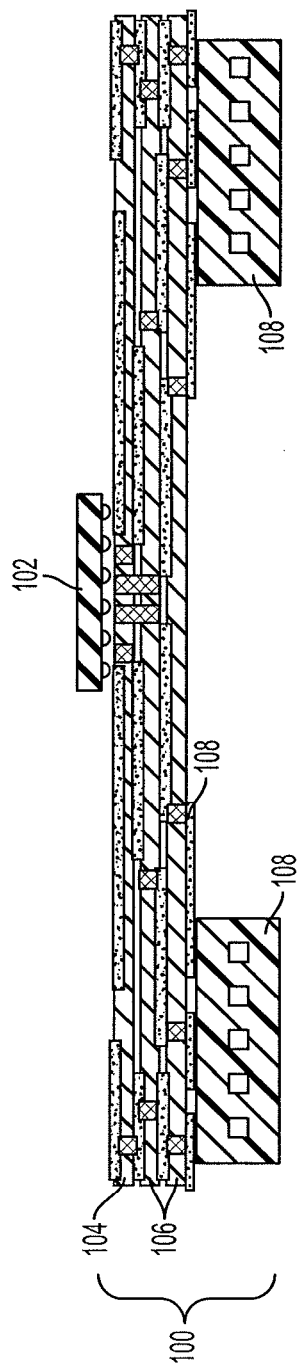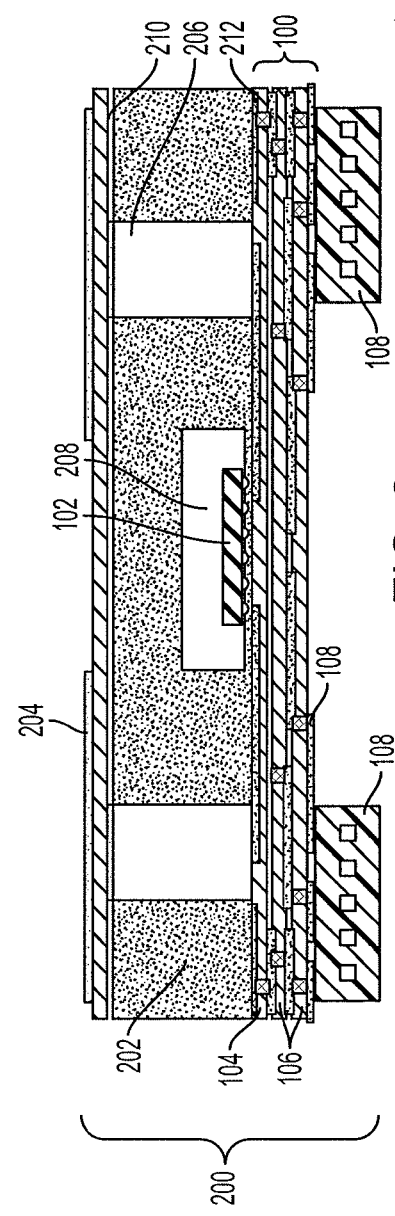

AUTOMOTIVE RADAR SUB-SYSTEM PACKAGING FOR ROBUSTNESS

BACKGROUND

1. Field

The invention relates to sub-systems of automotive radar and methods of manufacturing the same. More particularly, the invention relates to a radar sub-system module which houses a Radio Frequency Integrated Circuit (RFIC) and a waveguide signal transition through which the RFIC may communicate with an antenna array.

2. Description of the Related Art

Automotive radar systems are currently being provided in many automobiles. Over the past few years, automotive radar systems have been used with intelligent cruise control systems to sense and adjust the automobile's speed depending on traffic conditions. Today, automotive radar systems are being used with active safety systems to monitor the surroundings of an automobile for collision avoidance. Current automotive radar systems are divided into long range (for adaptive cruise control and collision warning) and short range (for pre-crash, collision mitigation, parking aid, blind spot detection, etc.). Current systems utilize a radio frequency integrated circuit (RFIC) device in order to process instructions and process communications to and from antenna arrays. A radar unit containing antenna arrays and an RFIC device may be considered a radar sub-system.

RFIC devices are very sensitive to, for example, dust, dirt, and other environmental exposure. Thus, it is desirable to be able to manufacture the RFIC device in a clean environment, such as a clean room, and to house the RFIC device in a sealed environment so that environmental factors (such as dust, dirt, etc.) do not degrade the quality of the RFIC device. This sensitivity creates a need for a sealed environment in which the RFIC device is to be positioned. However, manufacturing an entire radar system in a clean room may be cost prohibitive.

RFIC devices in current vehicular radar systems must be able to pass signals to the antennas. The RFIC device must also be able to communicate with support electronics, such as diodes, capacitors, control integrated circuits, etc. So, in addition to protecting the RFIC device, sub-system packaging must also allow communications between the RFIC device and the antenna circuits and the chip support elements. However, with the RFIC device being positioned in a sealed environment, many problems may arise. For example, communications with both circuits may be difficult (e.g., signal loss may be large, placement of through vias may be difficult, etc.); performance of the RFIC device is reduced; it may not be possible to manufacture and assemble the RFIC device to the sub-system in a clean environment; if the RFIC device is manufactured in a clean room, the entire module may be required to be manufactured in a clean room (increased cost); and any combination of the above problems.

Therefore, a need exists in the art for radar sub-system packaging which allows the RFIC device to be sealed from environmental elements, increases the performance of the RFIC device, allows the RFIC device to effectively communicate with support circuitry as well as antenna circuitry, and allows for less than the entire radar system to be manufactured in a clean room.

SUMMARY

A method for packaging a vehicular radar unit includes providing a first printed circuit board with a metal trace and a square metal section. An integrated circuit for processing transmitted and received signals is positioned on the first printed circuit board. A metal housing is also provided which has a first side and a second side which is opposite the first side. A second printed circuit board is provided which has a plurality of antenna elements and at least one transmission line. The first printed circuit board is bonded to the first side of the metal housing, and the second printed circuit board is bonded to the second side of the metal housing. A waveguide chamber is provided and is located between the first printed circuit board and the second printed circuit board. A signal is allowed to propagate from the integrated circuit to the metal trace to the square metal section to the waveguide chamber to the at least one transmission line to the plurality of antenna elements.

In another embodiment, a vehicular radar unit is disclosed. The vehicular radar unit includes a first printed circuit board having an integrated circuit configured to process transmitted and received signals, a metal trace, and a square metal section. The vehicular radar unit further includes a metal housing with a waveguide chamber formed within it, the waveguide chamber being located between a first side of the metal housing and a second side of the metal housing opposite the first side. The first side of the metal housing is bonded to the first printed circuit board. The vehicular radar unit also includes a second printed circuit board bonded to the second side of the metal housing and at least one transmission line and a plurality of antenna elements. In the vehicular radar unit, a signal may propagate from the integrated circuit to the metal trace to the square metal section to the waveguide chamber to the transmission line to the plurality of antenna elements.

In another embodiment, a vehicular radar unit is disclosed. The vehicular radar unit includes a first printed circuit board having an integrated circuit configured to process transmitted and received signals. The first printed circuit board also includes a metal trace electrically connected to the integrated circuit and a square metal section electrically connected to the metal trace. The vehicular radar unit also includes a second printed circuit board having at least two transmission lines and a plurality of antenna elements. Each of the plurality of antenna elements is electrically connected to at least one of the transmission lines. The vehicular radar unit also includes a metal housing with a waveguide chamber, a chip cavity, a first side bonded to the first printed circuit board and a second side opposite to the first side and bonded to the second printed circuit board. The square metal section on the first printed circuit board is positioned within the waveguide chamber. At least a part of the at least two transmission lines is also positioned within the waveguide chamber. The integrated circuit is positioned within the chip cavity such that the integrated circuit is encapsulated between the first printed circuit board and the metal housing. A signal may propagate from the integrated circuit to the metal trace to the square metal section to the waveguide chamber to the transmission line to the plurality of antenna elements.

BRIEF DESCRIPTION OF THE DRAWINGS

The features, objects, and advantages of the invention will become more apparent from the detailed description set forth below when taken in conjunction with the drawings, wherein:

FIG. 1 illustrates a cross-sectional view of a printed circuit board utilized to support a transmit/receive module in a vehicular radar sub-system according to an embodiment of the invention;

FIG. 2 illustrates a cross-section of an assembled sub-system of the vehicular radar system according to an embodiment of the invention;

DETAILED DESCRIPTION

Figure 3:
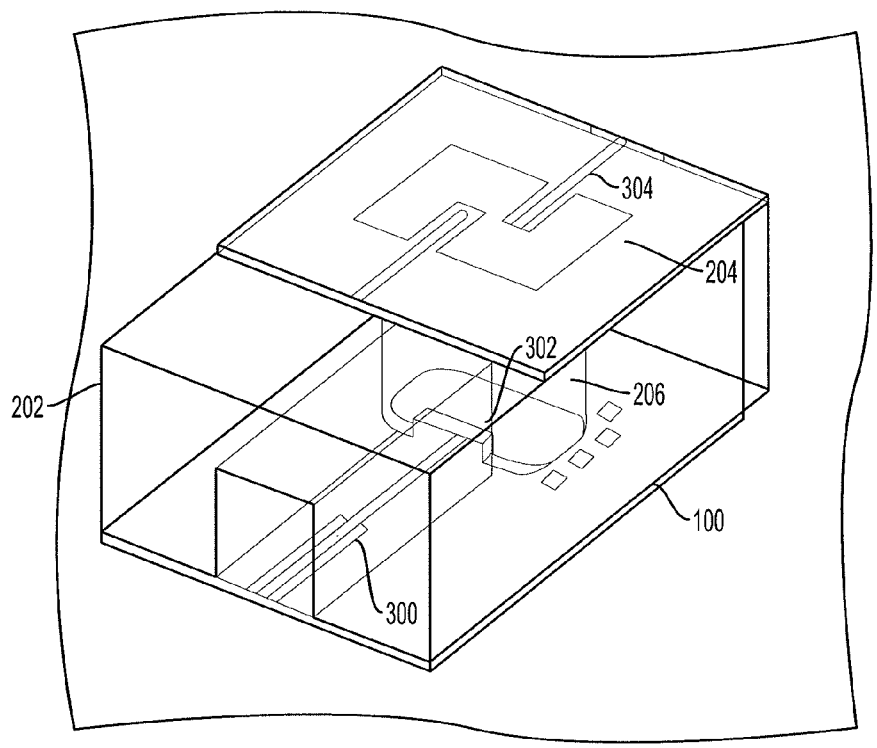
FIG. 3 illustrates a perspective view of the complete sub-system according to an embodiment of the invention.

Apparatus, systems and methods that implement the embodiments of the various features of the invention will now be described with reference to the drawings. The drawings and the associated descriptions are provided to illustrate some embodiments of the invention and not to limit the scope of the invention. Throughout the drawings, reference numbers are re-used to indicate correspondence between referenced elements. For purposes of this disclosure, when mentioned, a connection may be a wired connection, a wireless connection, or a mix of wired and wireless connections. A connection also provides for communications propagating both ways along the connection. For example, a connection with a processor provides for the processor to receive communications and to transmit communications over the connection.

The methods, systems and devices disclosed within provide several key advantages over the state of the art. For example, a vehicular radar sub-system disclosed within can be manufactured such that the disclosed sub-system is manufactured in a clean room and completely encapsulates an on-board radio frequency integrated circuit (RFIC). This results in the on-board RFIC being protected from environmental factors. This also allows for an entire radar system including multiple sub-systems to be assembled outside of a clean room resulting in a lower-cost manufacturing process. Also, the sub-system, which includes the RFIC and the printed circuit board upon which the RFIC is mounted, can be bonded to the metal housing in a clean room and the antennas can later be attached in a non-clean room environment.

Another benefit of the methods, systems and devices disclosed within is that the disclosed waveguide transition allows the antennas (or antenna elements) to communicate effectively with the RFIC without the difficulty of placing through vias and without the loss resulting from the use of through vias. This results in a simpler physical design of the sub-system as well as lower signal loss between the RFIC and the antennas.

These benefits are achieved using a combination of features. For example, the particular design of the waveguide transition allows for a very low signal loss and also provides signal filtering so that unwanted signals are removed from the transmitted signal. A metal section is located on the chip printed circuit board which transmits the signal through the waveguide towards the antennas. The metal section has close to or a square shape, which provides better signal transmission and reception through the waveguide transition. The antennas are connected to antenna signal lines and two signal lines are positioned within one waveguide chamber in a particular shape and opposite the metal section. The placement and shape of the metal section and the antenna signal lines provide the advantage of a lower signal loss through the waveguide chamber. Additionally, the design of the metal housing is important as it allows the RFIC to be sealed between the chip printed circuit board and the metal housing. This provides the advantage of protecting the RFIC. Another key feature is the method of manufacture. By placing the RFIC between the chip printed circuit board and the metal housing and bonding them together, the RFIC is sealed and protected from environmental factors so that the rest of a radar system can be manufactured at a lower cost.

Figure 6:
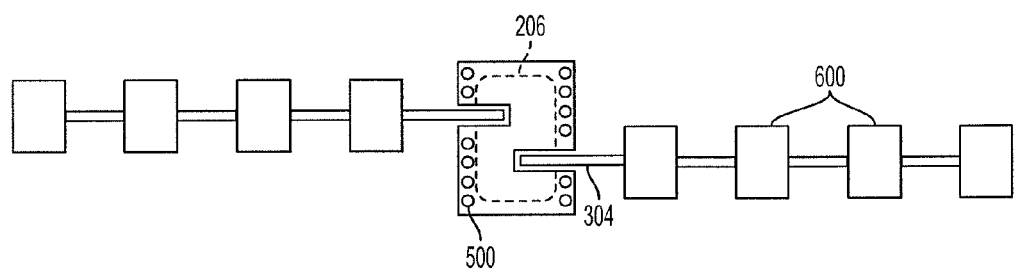
FIG. 6 illustrates an antenna attachment for transmitting and receiving a radar signal according to an embodiment of the invention.

FIG. 1 is a cross-sectional view of a printed circuit board (chip PCB) 100 utilized to support a transmit/receive module (T/R module) 102 in a vehicular radar sub-system. The T/R module 102 may be configured to transmit a signal for sensing surroundings through at least one antenna element 600 (FIG. 6). The T/R module 102 may also be configured to receive the transmitted signal through at least one antenna element 600 when the transmitted signal is reflected from the surroundings. In some embodiments, the T/R module 102 is configured to transmit signals to and receive signals from at least one antenna element 600. Furthermore, the T/R module 102 may be one single device or multiple devices. For example, the T/R module 102 may be a monolithic microwave integrated circuit (MMIC) or a Silicon-Germanium (SiGe) BiCMOS chip that may include one or more of the following: a T/R switch, a low noise amplifier (LNA), a variable gain amplifier (VGA), a power amplifier (PA), a phase shifter, a mixer, an intermediate frequency (IF) amplifier, and an analog-to-digital (A/D) converter. For example, it may generate and receive signals of any frequency between 76 GHz and 81 GHz, which basically covers the full automotive radar bandwidth available. The T/R module 102 may be in any type of packaging, for example, a wire-bond, flip-chip, or system on a chip (SOC) package.

In some embodiments, the T/R module 102 may be configured to generate and receive signals of any frequency, such as, for example, frequencies near the 24 GHz band, which is utilized as another automotive radar bandwidth.

The chip PCB 100 may be etched with a design which is appropriate for a phase array radar system. The chip PCB 100 may also have etched onto it a metal trace 300 (FIG. 3) connected to a metal section 302 (FIG. 3), which will be discussed herein. The chip PCB 100 may have more than one layer, and the layers may each be made of a different material. For example, a first layer 104 may be made of a high performance PCB construction material, such as a high performance radio frequency substrate. The T/R module 102 may be formed on or connected to the first layer 104. Other layers 106 may be made of any substrate available to construct a PCB, such as low cost FR4. The chip PCB 100 may, for example, have 3 other layers 106, or any other quantity of other layers 106, and it may have more than one layer of high performance PCB construction material as well. The first layer 104 may be of a higher quality because it may be required to operate at relatively high frequencies, which requires more precision than required by the function of the other layers.

The chip PCB 100 may also have assembled on it and/or connected to it a plurality of chips and/or components 108. The plurality of chips and/or components 108 may include one or more of the following: the T/R module 102, a digital signal processor (DSP), a digital clock, a temperature controller, a memory, a microprocessor, dynamic link libraries, a DC port, a data port, a voltage controlled oscillator, a PLL, a capacitor, a diode, a resistor, a connector, or any other component or chip. The plurality of chips and/or components 160 may be connected to one another, and to the T/R module 102, via wireless links or via connectors, such as micro-strip line, wire bonding, traces, wires, etc. on the chip PCB 100, either directly or through vias, and communications may propagate in either direction along the connections. The input and output signals to/from the T/R module 102 may be digital, DC, IF, RF or any other type of signals.

FIG. 2 illustrates a cross section of an assembled sub-system 200 of the vehicular radar system. One skilled in the art will realize that this vehicular radar system may be utilized in any type of vehicle, such as a car, truck, motorcycle, bicycle, watercraft, aircraft, etc.

The sub-system 200 may be a standalone vehicular radar system. It may also be one of many sub-systems of a vehicular radar system. For example, the sub-system 200 may transmit and receive radiofrequency signals from the antenna element 600 in a vehicular radar system, or the sub-system 200 may only transmit or receive these signals. In some embodiments, this sub-system 200 may be designed to operate only at certain frequencies, such as between 76 GHz and 81 GHz. In some embodiments, the vehicular radar system may include the sub-system 200, as well as sub-systems to operate at a lower frequency, such as near 24 GHz. In some embodiments, the vehicular radar system may include at least one sub-system 200, which may be designed to transmit and/or receive signals around the 76 GHz to 81 GHz band, and at least one other sub-system 200 designed to operate at a frequency near 24 GHz, which may transmit and/or receive signals around the 24 GHz band.

The sub-system 200 may include the chip PCB 100 and the plurality of chips and/or components 108, a metal housing 202 bonded onto the chip PCB 100 by a bonding material 212, an antenna PCB 204 which is also bonded to the metal housing 202 by a bonding material 210, at least one waveguide transition 206 within the metal housing 202, and at least one chip cavity 208 within the metal housing 202. The T/R module 102 may be positioned within the at least one chip cavity 208. The bonding materials 210 and 212 may be any material with which to bond the metal housing 202 to the PCB's 100 and 204, but it is preferred that the bonding materials 210 and 212 be conductive. Conductive bond material may allow the metal housing 202 to be bonded to ground planes on the PCBs 100 and 204, and become electrically connected to a common ground signal.

The antenna PCB 204 (along with the chip PCB 100) may be formed from any PCB construction material, such as a liquid crystal polymer (LCP), a low temperature cofired ceramic (LTCC), a Parylene N dielectric, a polytetrafluoroethylene (PTFE) ceramic, a PTFE glass fiber material, or any high performance substrate. The antenna PCB 204 may have at least one antenna element 600 (e.g., a portion of an antenna or an antenna) formed within it or connected to it, and may have a signal line 304 (FIG. 3) formed within it or connected to it. For example, the antenna element 600 may be etched onto the antenna PCB 204 or may be electrically connected through a wire, microstrip, or any other connection. The antenna PCB 204 may include and/or be connected to at least one of a transmission antenna and a reception antenna. The transmission antenna may transmit a signal (which may be received from or by the T/R module 102) for sensing surroundings. The transmitted signal may reflect off of surrounding objects, and be received by the reception antenna.

The metal housing 202 may be created with any conductive metal. For example, it may be created with aluminum so that it may be more lightweight and thin while retaining conductivity. The metal housing 202 may be created with at least one waveguide transition 206 formed within it. The purpose of the waveguide transition 206 is to act as a transition of a signal between the chip PCB 100 and the antenna PCB 204.

The metal housing 202 may also have a chip cavity 208 formed within it, such that the T/R module 102 may be positioned within the chip cavity 208. As the chip PCB 100 is bonded to one side of the metal housing 202 by the bonding material 212 and the antenna PCB 204 is bonded to the other side of the metal housing 202 by bonding material 210, a method of communication between the chip PCB 100 and the antenna PCB 204 is desirable. The waveguide transition 206 facilitates this communication between the chip PCB 100 and the antenna PCB 204. This waveguide transition 206 may block signals below 62 GHz, which allows ease of compliance with common frequency regulations. Additionally, the waveguide transition 206 may greatly reduce the strength of signals lower than around 76 GHz and higher than around 81 GHz. In other words, the waveguide transition 206 may filter signals such that only signals of a desired bandwidth range are passed through the waveguide transition 206. In other embodiments, the waveguide transition 206 may be configured to greatly reduce the signal strength of signals away from the 24 GHz band.

If the radar sub-system 200 were to utilize a high frequency via in order to allow a signal to transfer in either or both directions to/from the chip PCB 100 and to/from the antenna PCB 204 instead of a waveguide transition 206, the signal would degrade in quality. The repeatability of via construction is not sufficient for high frequency low cost applications. The rough surface within the via causes loss in the signal strength. When dealing with weak signals, such as reflected radar signals, any significant loss in signal strength can result in signal strength below a threshold value such that reception may be difficult or impossible.

The waveguide transition 206, on the other hand, results in a very small signal strength loss, that is, less than near 1 dB per output branch for signals between the near 76 GHz to near 81 GHz bands. An output branch may be, for example, a signal line 304 (FIG. 3). This is due to the characteristics of the waveguide transitions 206 as well as the design of this specific waveguide transition 206. Thus, this waveguide transition 206 is preferable over utilizing signal vias or other differently shaped waveguide transitions 206 used to communicate between the chip PCB 100 and the antenna PCB 204.

The specific design and shape of the waveguide transition 206 referred to herein is of an optimal design and shape. If the waveguide transition 206 was formed in another design or shape, then the loss may be greater that disclosed herein, resulting in the separation of the two PCB's becoming difficult to design as signal loss would be significant.

FIG. 3 illustrates a perspective view of the complete sub-system 200. At the bottom of the sub-system 200, the chip PCB 100 may be bonded to the metal housing 202.

Positioned on the chip PCB 100 is a metal trace 300, which may propagate input and output signals between the T/R module 102 and a metal section 302. The metal trace 300 may be any trace on the chip PCB 100, a micro-strip line or wire bonding. For example, the metal trace 300 may be made of copper, aluminum or any other conductive metal. One end of the metal trace 300 may be connected to the metal section 302, which is positioned on the chip PCB 100. The metal section 302 is at least partially positioned within the waveguide transition 206 when the metal housing 202 is bonded to the chip PCB 100.

The metal section 302 may be made of copper, aluminum or any other conductive metal. In one embodiment, the metal section 302 is made of copper. The metal section 302 is close to or a square shape. The square shape of the metal section 302 provides higher powered transmission and reception signals. The metal section may couple a signal between the metal trace 300 and the waveguide transition 206. On the antenna side of the sub-system 200 (top of FIG. 3), the antenna PCB 204 may be bonded to the metal housing 202 by any bonding material, but preferably by a conductive bonding material. The signal line 304 may be positioned on the antenna PCB 204 in such a location as to be at least partially positioned within the waveguide transition 206 when the metal housing 202 is bonded to the antenna PCB 204. The signal line 304 may be connected to elements on the antenna PCB 204, such as one or more antenna elements 600 or any antenna support components or chips.

In one embodiment, two signal lines 304 are positioned such that part of each signal line 304 is located within the waveguide transition 206. As illustrated in FIG. 3, the signal lines 304 may be positioned such that the signal lines 304 are parallel to each other and enter the waveguide transition 206 from a first side and a second side, where the first and second sides are opposite. Furthermore, one signal line 304 may be positioned closer to a third side of the waveguide transition 206. The other signal line 304 may be positioned closer to a fourth side of the waveguide transition 206. Hence, the third and fourth sides are opposite one another, and all four sides of the waveguide transition are on a plane which is perpendicular or nearly perpendicular to the plane of the antenna PCB 204. This results in the signal lines 304 being on the same or nearly the same plane as the antenna PCB 204, entering from opposite directions and reaching slightly less than halfway into the waveguide transition 206. If the lines of the signal lines 304 extended indefinitely, each signal line 304 would be too close to opposite sides of the waveguide transition 206 (or distanced from each other in a direction perpendicular to the signal lines 304 on the same or similar plane as the antenna PCB 204) such that they would not meet or cross one another.

The signal line 304 may be a trace on the antenna PCB 204, a micro-strip line or wire bonding. For example, the signal line 304 may be made of copper, aluminum or any other conductive metal. The signal line 304 receives the signal from the T/R module 102, via the metal trace 300, the metal section 302 and the waveguide transition 206, and/or transmits the signal to the T/R module 102, via the metal section 302, the metal trace 300 and the waveguide transition 206. Thus, between the T/R module 102 and elements on the antenna PCB 204 (such as the antenna element 600), a metal to waveguide to metal connection is formed. This connection, for example, may be a microstrip to waveguide to microstrip transition.

Figure 4:
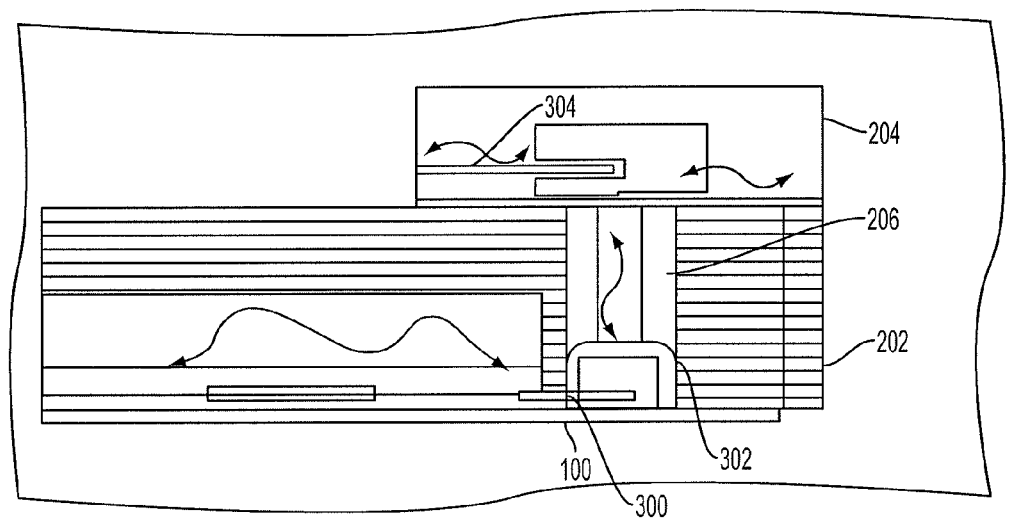
FIG. 4 illustrates a dissected view of the sub-system according to an embodiment of the invention.

FIG. 4 illustrates a dissected view of the sub-system 200. As illustrated, the chip PCB 100 is located at the bottom of the metal housing 202. The chip PCB 100 includes the metal trace 300 and the metal section 302. The chip cavity 208 is located within the metal housing 202, which allows room for the metal housing 202 to sit on the chip PCB 100 and enclose the T/R module 102 without the metal housing 202 causing damage to the chip PCB 100 or the T/R module 102. This also results in protection of the T/R module 102 from environmental factors, as the chip cavity 208 is a sealed environment between the chip PCB 100 and the metal housing 202 after bonding. The metal housing 202 also contains a waveguide transition 206, which allows a signal to propagate between the metal section 302 and the signal line 304. As illustrated, the antenna PCB 204 is bonded to the opposite side of the metal housing 202 than the chip PCB 100 is bonded to.

A signal may be generated by the T/R module 102. After leaving the T/R module 102, the signal may propagate along conductive circuitry within the chip PCB 100, may propagate along a wireless path, or any combination of the two. Along this path, the signal may be processed by any of the chips and/or components 108 (not shown) until it reaches the metal trace 300. The signal may then propagate along the metal trace 300 until it reaches the metal section 302. The metal section 302 effectively couples the signal from the metal trace 300 to the waveguide transition 206. Once in the waveguide transition 206, the signal propagates through the waveguide transition 206 where it is coupled to the antenna PCB 204 by the signal line 304. After the signal reaches the antenna PCB 204, it may then be propagated to one or more antenna elements 600 (not shown) and then away from the sub-system 200 by the antenna elements 600, such that it may reflect off of nearby objects. Once the signal is reflected, the antenna elements 600, or any other antenna, may receive the signal, and transmit it back through the antenna PCB 204. After propagating through a portion of the antenna PCB 204, the signal line 304 may propagate the signal back through the waveguide transition 206, where the metal section 302 may receive it and transfer it, via the metal trace 300, to the chip PCB 100, where the signal may be processed by any of the chips and/or components 108 and finally propagated back to the T/R module 102.

Figure 5:
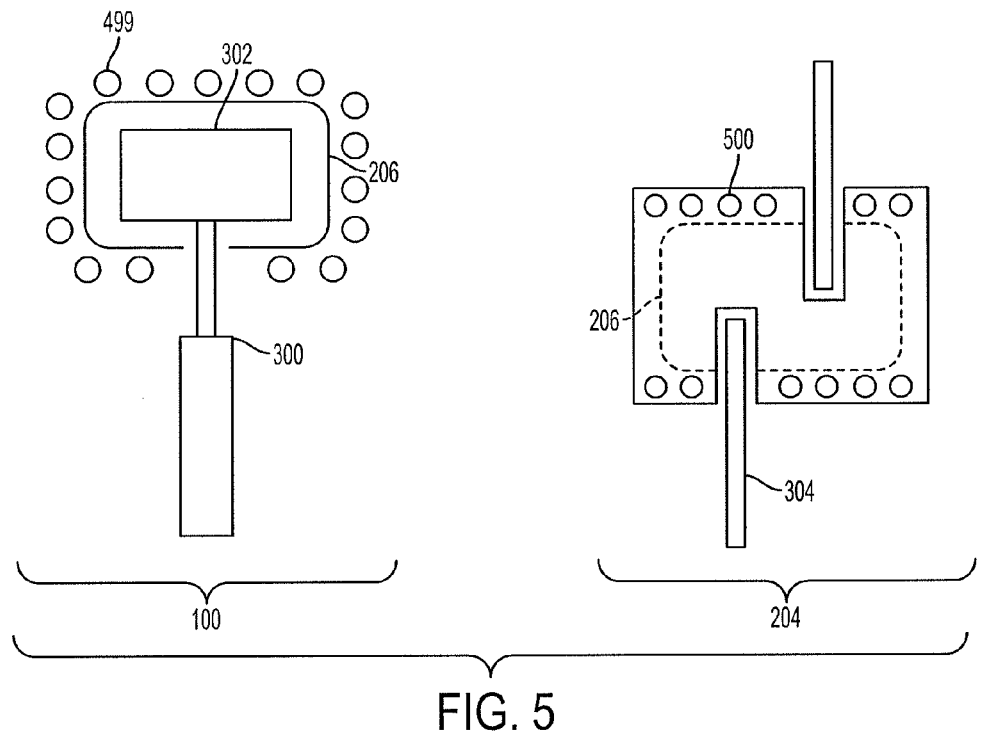
FIG. 5 illustrates a top-down view of the location near the waveguide transition on the chip PCB and on the antenna PCB according to an embodiment of the invention.

FIG. 5 illustrates a top-down view of the location near the waveguide transition 206 on the chip PCB 100 and on the antenna PCB 204. On the left side of FIG. 5, the chip PCB 100 side of the waveguide transition 206 is illustrated, and on the right side of FIG. 5, the antenna PCB 204 side of the waveguide transition 206 is illustrated. On the chip PCB 100 side, the metal trace 300, which is connected to the chip PCB 100, leads to the metal section 302, which is located within the waveguide transition 206. As shown, the metal section 302 may not entirely fill the surface area of the waveguide transition 206, and may be a square shape, as illustrated in FIG. 5 on the left hand side. Additionally, FIG. 5 illustrates ground vias 499 within the chip PCB 100, which may be utilized to connect the ground planes of the chip PCB 100 to the metal housing 202.

From the chip PCB 100 side, the signal may depart the metal section 302 and propagate through the waveguide transition 206 and be coupled to the antenna PCB 204 by utilizing a complex shape. This shape is displayed in FIG. 5 on the right hand side, and includes the position of the signal lines 304 within the waveguide transition 206. Ground vias 500 are utilized within the antenna PCB 204, and may assist the coupling of the signal to the antenna PCB 204 from the waveguide transition 206. These ground vias 500 may also be utilized to connect the ground planes of the antenna PCB 204 to the metal housing 202. Thus, the waveguide transition 206 may be utilized to allow the signal to propagate between the chip PCB 100 and the antenna PCB 204. By utilizing the metal housing 202, the sub-system 200 packaging may be more robust and rigid. Furthermore, the waveguide transition 206 discussed within may optimize performance of signal propagation by filtering low frequency signals, such as, under 62 GHz and allowing signals to pass with a high signal strength, for example, between 76 GHz and 81 GHz.

The ground vias 499 and 500 are designed such that the chip PCB 100 and the antenna PCB 204 may be electrically connected to the metal housing 202, which provides a ground voltage for the sub-system 200. These ground vias 499 and 500 result in the metal housing 202 being electrically connected to a ground plane within each of the chip PCB 100 and the antenna PCB 204.

The heat from the T/R module 102 may be transmitted away from the T/R module 102 by the ground vias 499 and 500 to the ground planes in the chip PCB 100 and the antenna PCB 204. From the ground planes, the heat may dissipate throughout the chip PCB 100 and the antenna PCB 204. Furthermore, these ground planes may be connected to the metal housing 202 by both the ground vias 499 and 500 as well as in other locations of the metal housing 202. From the ground planes, the heat may also propagate to the metal housing 202 where it is further dissipated.

FIG. 6 illustrates one embodiment of an antenna array for transmitting and receiving signals. For example, the antenna array in FIG. 6 may represent the antenna element 600 in FIG. 3. The waveguide transition 206 location on the antenna PCB 204 is illustrated, as well as the ground vias 500. Also illustrated is the signal line 304. A plurality of antenna elements 600 are connected to the signal line 304. While more than one antenna element 600 is shown, the number of antenna elements 600 may range from 1 to an almost infinite number of antenna elements 600. It is also important to note that while one embodiment of the antenna attachment is illustrated, many other embodiments of antenna arrays may be utilized with this sub-system. For example, antenna elements 600 may be attached to each other and the signal line 304 in series, in parallel or in a combination of series and parallel. There may be antenna elements 600 for one range of frequencies overlaying antenna elements 600 from another range of frequencies. The antenna elements 600 of different frequencies may be combined into a complex antenna element 600. The antenna elements 600 of two or more frequencies may be connected in parallel, series, or a combination of the two within the same circuit as each other; or any other antenna attachment configuration may be utilized. In some embodiments, the antenna attachment may be configured to operate with a phase array radar system.

The automotive radar sub-system 200 may be a stand-alone sub-system or it may be one of many automotive radar sub-systems 200 within an automotive radar system. For example, the sub-system 200 may be utilized within an automotive radar system alone, with other sub-systems 200 of this type, or with other sub-systems 200 of at least one more design. For example, this sub-system 200 may be part of a system which includes other sub-systems 200 of this design (which cover the full automotive radar bandwidth from 76 GHz to 81 GHz). This sub-system 200 may also be part of a vehicular radar system which includes sub-systems 200 of other designs, or a combination of any sub-systems 200. For example, the other sub-systems may be sub-systems designed to operate within the 76 GHz to 81 GHz range and may be sub-systems designed to operate within the 24 GHz range.

Figure 7A:
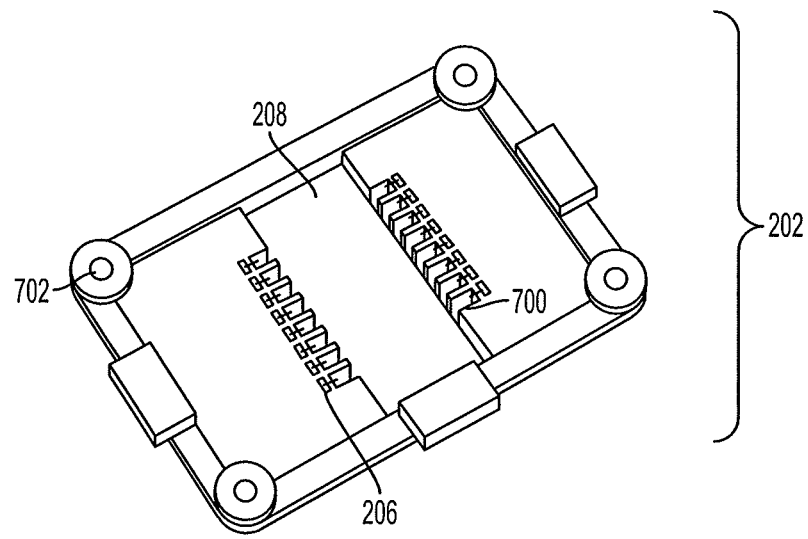
FIG. 7A illustrates a metal housing of the sub-system according to an embodiment of the invention.

FIG. 7A illustrates an embodiment of the metal housing 202. In the embodiment illustrated in FIG. 7A, the side of the metal housing 202 is shown on which the chip PCB 100 is to be mounted. The chip cavity 208 is illustrated in the middle of the metal housing 202. The T/R module 102 is to be located within the chip cavity 208, and the chip PCB 100 is to be positioned so that it will cover at least a portion of the metal housing 202 and will encapsulate the T/R module 102. This allows for the T/R module 102 to be protected from environmental factors after the sub-system 200 is manufactured.

In some embodiments, there are multiple waveguide transitions 206 formed within the metal housing 202 and are located in the waveguide transition 206 outline areas as shown in FIG. 7A. In other embodiments, there is only one waveguide transition 206 formed in the metal housing 202. In some embodiments, such as the embodiment illustrated in FIG. 7A, the metal trace outline 700 is formed within the metal housing 202, adjacent to where the T/R module 102 is positioned. In other embodiments, the metal trace 300 may be positioned in remote locations from the T/R module 102.

In the example in FIG. 7A, one T/R module 102 is positioned within the metal housing 202. From the T/R module 102 to the waveguide transitions 206 are many metal trace outlines 700 within which metal traces 300 are positioned. Positioned at the end of the metal trace outlines 700 are metal sections 302 within the waveguide transitions 206. Each waveguide transition 206 may be within a single sub-system 200, and therefore positioned between a metal section 302 and at least one signal line 304. The embodiment in FIG. 7A may illustrate one automotive radar system or a group of automotive radar sub-systems 200 which may still represent only a portion of an automotive radar system.

In some embodiments, the metal housing 202 may include connector holes 702 formed within it. These connector holes 702 may enable the sub-system 200 to be attached to a vehicle. These connector holes 702 may also enable the sub-system 200 to be attached to other sub-systems 200. In one embodiment, one sub-system 200 in the frequency range of 76 GHz to 81 GHz may be attached to at least one more sub-system 200 in the same frequency range. In some embodiments, one or more sub-systems 200 in the frequency range of 76 GHz to 81 GHz may be connected to one or more sub-systems 200 near the 24 GHz frequency also utilized by vehicular radar. In some embodiments, one or more sub-systems 200 may be connected to one or more sub-systems 200 of any other design. In some embodiments, the connector holes 702 may be utilized to attach the chip PCB 100 to the metal housing 202. Additionally, the connector holes 702 may be attached to any combination of other sub-systems 200, chip PCBs 100, and a vehicle.

Figure 7B:
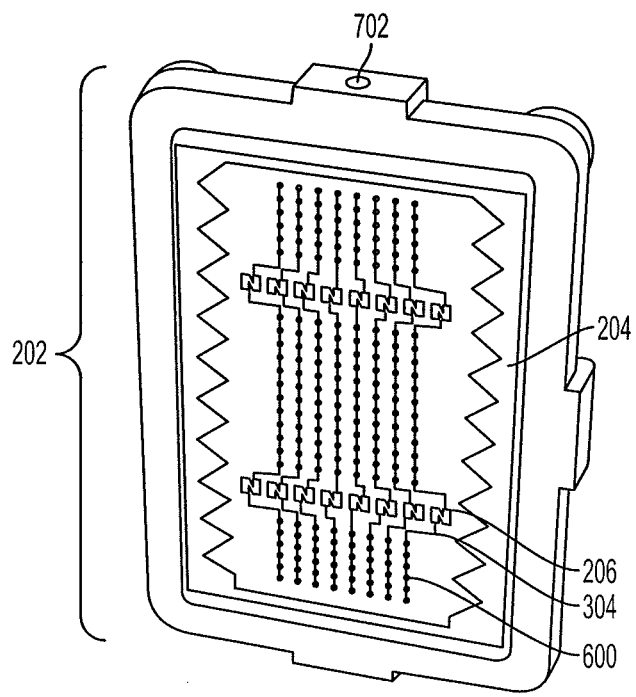
FIG. 7B illustrates an antenna PCB attached to the metal housing of the sub-system according to an embodiment of the invention.

FIG. 7B illustrates an embodiment of the antenna PCB 204 attached to the metal housing 202. In FIG. 7A, one connector hole 702 is visible at the top of the diagram, and another connector hole 702 to illustrate that the chip PCB 100 is on the opposite side of the metal housing 202 than the antenna PCB 204. As illustrated in the embodiment of FIG. 7B, there are multiple waveguide transition 206 outlines on the antenna PCB 204. In other embodiments, the sub-system 200 may only be configured to include one waveguide transition 206.

In the embodiment illustrated in FIG. 7B, there are multiple arrays of antenna elements 600 existing on the antenna PCB 204. These antenna elements 600 may be fabricated on the antenna PCB 204 or electrically connected to the antenna PCB 204. In this embodiment, two signal lines 304 may transmit and/or receive a signal to and/or from the waveguide transition 206 (the waveguide transitions 206 being located on the opposite side of the antenna PCB 204 from the antenna elements 600, and located near the location of the waveguide outline 206) for each waveguide transition 206.

Figure 8:
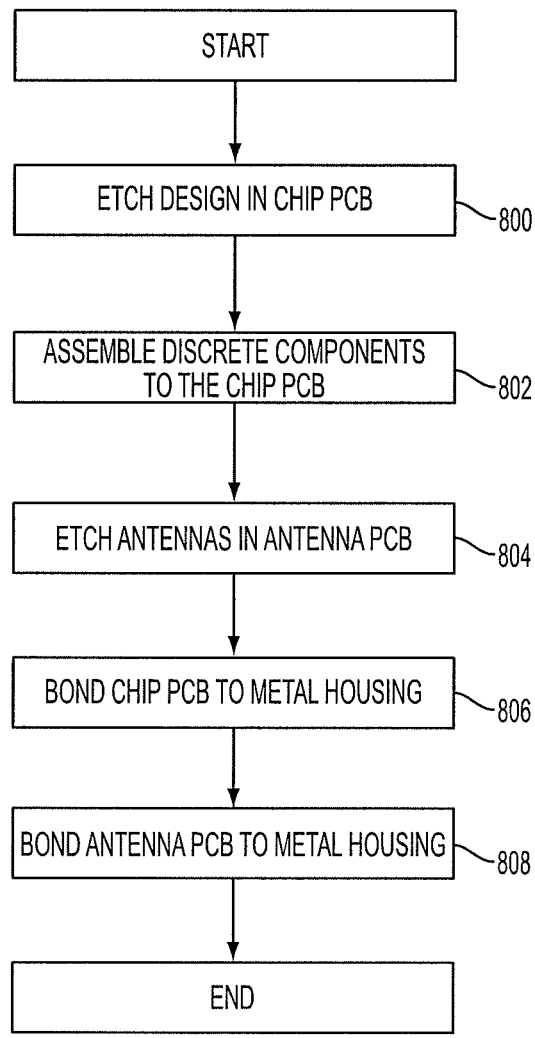
FIG. 8 illustrates an exemplary method for manufacturing the automotive radar sub-system for robustness according to an embodiment of the invention.

FIG. 8 illustrates an exemplary method for manufacturing the automotive radar sub-system 200 for robustness. In block 800, a design is etched onto the chip PCB 100. This design may be appropriate for the radar sub-system 200 described herein. This design may also be appropriate for any type of radar system. The chip PCB 100 may include layers of different types of substrates. For example, it may contain one layer of high performance RF substrate and three layers of low cost FR4, or other low-cost substrate, for example, for digital logic routing. The chip PCB 100 may also have etched on it and/or connected to it the metal trace 300 and the metal section 302.

In block 802, discrete components may be assembled on or attached to the chip PCB 100. For example, the components may include the T/R module 102, support components such as capacitors, diodes, control ICs, connectors, and any other component which may be utilized in radar systems and this type of sub-system 200.

In block 804, the antenna PCB 204 may be etched. For example, antenna elements 600 may be etched onto the antenna PCB 204 in any configuration, such as series, parallel, a combination, or any other possible configuration of antenna elements 600. Likewise, support components may be etched onto and/or connected to the antenna PCB 204, such as ICs, capacitors, diodes, connectors, and any other components which may be utilized in radar systems, antenna attachments, and/or the sub-system 200. Furthermore, the antenna PCB 204 may be assembled such that the complex shape is formed where the waveguide transition 206 will be located. Likewise, the signal line 304 may be etched on or attached to the antenna PCB 204 such that the signal may propagate to and/or from the antenna elements 600 and from and/or to the waveguide transition 206. The antenna PCB 204 may be made of a high performance substrate, or any other substrate on which antenna attachments may be formed.

In block 806, the chip PCB 100 may be bonded to a first side of the metal housing 202. The metal housing 202 has formed within it the waveguide transition 206. The waveguide transition 206 may be machined in the metal housing 202. The metal housing 202 also includes a chip cavity 208, which may be machined in the metal housing 202. The metal housing 202 is double sided. The T/R module 102 is positioned within the chip cavity 208 such that the T/R module 102 is encapsulated between the metal housing 202 and the chip PCB 100, with only those two elements surrounding the T/R module 102.

In block 808, the antenna PCB 204 is bonded onto a second side of the metal housing 202, which is opposite the first side of the metal housing 202. The bond material may be a conductive material, such that the metal parts of the metal housing 202 may be bonded to ground planes on the chip PCB 100 and/or the antenna PCB 204 to form an electrical connection. The waveguide transition 206 may be positioned such that it is positioned on the metal section 302 on the chip PCB 100, and in the vicinity of the complex shape and the signal line 304 on the antenna PCB 204 when the metal housing 202 is bonded to the chip PCB 100 and the antenna PCB 204.

By utilizing this method of manufacturing, the automotive radar sub-system 200 for robustness, the T/R module 102 may be completely sealed off from environmental exposure, such as dirt, dust, and the like. The T/R module 102 may be located within the chip cavity 208 of the metal housing 202, and be sealed between the chip PCB 100 and the metal housing 202 in order to prevent exposure to environmental elements. Furthermore, this method allows part of the radar system (the sub-system 200) to be assembled in a clean room, so that fragile components, such as the T/R module 102, are not exposed to environmental elements. Additionally, this method eliminates the requirement for the T/R modules 102 to be positioned in its own protective packaging, as it is already protected by the chip PCB 100 and the metal housing 202. This method also allows for a full radar system to be assembled outside of a clean room, as the fragile components, such as the T/R module 102, are sealed from environmental exposure within the sub-system 200 and have been previously manufactured within a clean room. Thus, assembly of more than one sub-system 200 and other modules as a system may be performed outside of a clean room, which reduces cost in the manufacturing process for the entire radar system.

Those of ordinary skill would appreciate that the various illustrative logical blocks, modules, and algorithm steps described in connection with the examples disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the disclosed apparatus and methods.

The various illustrative logical blocks, modules, and circuits described in connection with the examples disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the examples disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an Application Specific Integrated Circuit (ASIC). The ASIC may reside in a wireless modem.

In the alternative, the processor and the storage medium may reside as discrete components in the wireless modem.

The previous description of the disclosed examples is provided to enable any person of ordinary skill in the art to make or use the disclosed methods and apparatus. Various modifications to these examples will be readily apparent to those skilled in the art, and the principles defined herein may be applied to other examples without departing from the spirit or scope of the disclosed method and apparatus. The described embodiments are to be considered in all respects only as illustrative and not restrictive and the scope of the invention is, therefore, indicated by the appended claims rather than by the foregoing description. All changes which come within the meaning and range of equivalency of the claims are to be embraced within their scope.

What is claimed is:

1. A method of packaging a vehicular radar unit, the method comprising:
    providing a first printed circuit board;
    positioning an integrated circuit for processing transmitted and received signals on the first printed circuit board;
    providing a metal housing having a first side and a second side opposite the first side;
    providing a second printed circuit board with a plurality of antenna elements and at least one transmission line;
    bonding the first printed circuit board to the first side of the metal housing;
    bonding the second printed circuit board to the second side of the metal housing;
    providing a waveguide chamber located between the first printed circuit board and the second printed circuit board; and
    allowing a signal to propagate from the integrated circuit to the plurality of antenna elements.

2. The method of claim 1 wherein the integrated circuit is sealed from environmental exposure between the first printed circuit board and the metal housing.

3. The method of claim 1 wherein the waveguide chamber is configured to reduce the strength of signals below 76 GHz.

4. The method of claim 1 wherein at least one of the first printed circuit board is bonded to the first side of the metal housing using conductive bonding material or the second printed circuit board is bonded to the second side of the metal housing using conductive bonding material.

5. The method of claim 1 wherein the at least one transmission line includes at least two transmission lines and providing the waveguide chamber includes positioning two of the at least two transmission lines in the waveguide chamber.

6. The method of claim 1 wherein the integrated circuit is packaged in a wire-bond package, a flip-chip package or a system on a chip package.

7. The method of claim 1 wherein the first printed circuit board includes a metal trace and a square metal section.

8. The method of claim 7 further comprising allowing a signal to propagate from the plurality of antenna elements to the at least one transmission line to the waveguide chamber to the square metal section to the metal trace to the integrated circuit.

9. The method of claim 7 wherein allowing the signal to propagate from the integrated circuit to the plurality of antenna elements includes allowing a signal to propagate from the integrated circuit to the metal trace to the square metal section to the waveguide chamber to the at least one transmission line to the plurality of antenna elements.

10. A vehicular radar unit comprising:
    a first printed circuit board having an integrated circuit configured to process transmitted and received signals;
    a metal housing with a waveguide chamber formed within it, the waveguide chamber being located between a first side of the metal housing and a second side of the metal housing opposite the first side and allowing a signal to propagate from the integrated circuit to the plurality of antenna elements, wherein the first side of the metal housing is bonded to the first printed circuit board; and
    a second printed circuit board bonded to the second side of the metal housing and having at least one transmission line and a plurality of antenna elements.

11. The vehicular radar unit of claim 10 wherein the integrated circuit is sealed from environmental exposure between the first printed circuit board and the metal housing.

12. The vehicular radar unit of claim 10 wherein the waveguide chamber is configured to reduce the strength of signals below 76 GHz.

13. The vehicular radar unit of claim 10 wherein at least one of the first printed circuit board is bonded to the first side of the metal housing using conductive bonding material or the second printed circuit board is bonded to the second side of the metal housing using conductive bonding material.

14. The vehicular radar unit of claim 10 wherein the at least one transmission line includes at least two transmission lines and two of the at least two transmission lines is positioned within the waveguide chamber.

15. The vehicular radar unit of claim 10 wherein the integrated circuit is packaged in a wire-bond package, a flip-chip package or a system on a chip package.

16. The vehicular radar unit of claim 10 wherein the first printed circuit board includes a metal trace and a square metal section.

17. The vehicular radar unit of claim 16 wherein a signal may propagate from the plurality of antenna elements to the at least one transmission line to the waveguide chamber to the square metal section to the metal trace to the integrated circuit.

18. The vehicular radar unit of claim 16 wherein allowing the signal to propagate from the integrated circuit to the plurality of antenna elements includes allowing a signal to propagate from the integrated circuit to the metal trace to the square metal section to the waveguide chamber to the at least one transmission line to the plurality of antenna elements.

19. A vehicular radar unit comprising:
    a first printed circuit board having an integrated circuit configured to process transmitted and received signals, a plurality of metal traces electrically connected to the integrated circuit, and a plurality of square metal sections electrically connected to the plurality of metal traces;
    a second printed circuit board having a plurality of transmission lines and a plurality of antenna elements, wherein each of the plurality of antenna elements is electrically connected to at least one of the plurality of transmission lines; and
    a metal housing having a plurality of waveguide chambers, a chip cavity, a first side bonded to the first printed circuit board and a second side opposite to the first side and bonded to the second printed circuit board, wherein:
        the plurality of square metal sections on the first printed circuit board are positioned within the plurality of waveguide chambers, at least a portion of each of the plurality of transmission lines is positioned within one of the plurality of waveguide chambers, the integrated circuit is positioned within the chip cavity such that the integrated circuit is encapsulated between the first printed circuit board and the metal housing, and a plurality of signals may propagate from the integrated circuit to each of the plurality of metal traces to each of the plurality of square metal sections to the each of the plurality of waveguide chambers to each of the plurality of transmission lines to each of the plurality of antenna elements.

20. The vehicular radar unit of claim 19 wherein the integrated circuit is a monolithic microwave integrated circuit.

* * * * *